United States Patent
Mori et al.

(10) Patent No.: US 9,320,140 B2
(45) Date of Patent: Apr. 19, 2016

(54) TOUCH SENSOR WITH ORNAMENT, METHOD OF MANUFACTURING SAME, AND TRANSPARENT CONDUCTIVE SENSOR USED IN SAME

(71) Applicant: NISSHA PRINTING CO., LTD., Kyoto-shi, Kyoto (JP)

(72) Inventors: Fujio Mori, Kyoto (JP); Fumiaki Shibayama, Kyoto (JP); Hiroko Shimizu, Kyoto (JP); Hideki Koide, Kyoto (JP)

(73) Assignee: NISSHA PRINTING CO., LTD., Kyoto (JP)

( * ) Notice: Subject to any disclaimer, the term of this patent is extended or adjusted under 35 U.S.C. 154(b) by 71 days.

(21) Appl. No.: 14/367,778

(22) PCT Filed: Dec. 17, 2012

(86) PCT No.: PCT/JP2012/082663
§ 371 (c)(1),
(2) Date: Jun. 20, 2014

(87) PCT Pub. No.: WO2013/094561
PCT Pub. Date: Jun. 27, 2013

(65) Prior Publication Data
US 2015/0107881 A1    Apr. 23, 2015

(30) Foreign Application Priority Data

Dec. 22, 2011 (JP) .................................. 2011-281600
Jan. 12, 2012 (JP) .................................. 2012-003961

(51) Int. Cl.
*H05K 1/03* (2006.01)
*H05K 1/02* (2006.01)
(Continued)

(52) U.S. Cl.
CPC ............ *H05K 1/0296* (2013.01); *B32B 17/064* (2013.01); *B32B 17/10174* (2013.01);
(Continued)

(58) Field of Classification Search
CPC .............. H05K 1/02; H05K 1/09; H05K 3/00; H05K 3/061; G06F 3/041; G06F 3/044; G06F 3/045
USPC .............. 174/255, 250; 345/173, 174; 428/77; 216/13, 20; 178/18.06
See application file for complete search history.

(56) References Cited

U.S. PATENT DOCUMENTS

2009/0046077 A1* 2/2009 Tanaka et al. .................. 345/174
2010/0159183 A1* 6/2010 Nishimura ....................... 428/77
(Continued)

FOREIGN PATENT DOCUMENTS

JP    2009-169974 A    7/2009
JP    2012-043165 A    3/2012
JP    2012-208857 A    10/2012

OTHER PUBLICATIONS

International Search Report in PCT/JP2012/082663 dated Mar. 19, 2013.

*Primary Examiner* — Xiaoliang Chen
(74) *Attorney, Agent, or Firm* — Global IP Counselors, LLP

(57) ABSTRACT

A touch sensor with an ornament includes a transparent substrate with a flat center part and a raised outer rim part, and a film substrate based transparent conductive sensor with a transparent conductive film layer attached to the inner face of the transparent substrate. A transparent conductive film layer circuit of the transparent conductive film layer is formed at the flat center part, and a routing circuit for detecting an electric signal from the transparent conductive film layer circuit and a decorative print layer for concealing the routing circuit are formed at the raised outer rim part.

19 Claims, 3 Drawing Sheets

(51) Int. Cl.
*C03C 17/32* (2006.01)
*G06F 3/041* (2006.01)
*B32B 17/06* (2006.01)
*B32B 17/10* (2006.01)
*B32B 37/10* (2006.01)
*B32B 38/10* (2006.01)
*G02B 5/30* (2006.01)

(52) U.S. Cl.
CPC ............. *B32B37/1027* (2013.01); *B32B 38/10* (2013.01); *C03C 17/32* (2013.01); *G02B 5/3033* (2013.01); *G06F 3/041* (2013.01); *H05K 1/0306* (2013.01); *H05K 2201/09018* (2013.01); *H05K 2201/10151* (2013.01)

(56) References Cited

U.S. PATENT DOCUMENTS

| 2010/0284132 | A1 | 11/2010 | Yi et al. | |
|---|---|---|---|---|
| 2011/0115738 | A1* | 5/2011 | Suzuki et al. | 345/173 |
| 2011/0132670 | A1* | 6/2011 | Yeh et al. | 178/18.06 |
| 2012/0249452 | A1 | 10/2012 | Kitano et al. | |
| 2013/0000954 | A1* | 1/2013 | Hashimoto et al. | 174/250 |
| 2013/0056440 | A1* | 3/2013 | Iwase et al. | 216/20 |

* cited by examiner

TOUCH SENSOR WITH ORNAMENT, METHOD OF MANUFACTURING SAME, AND TRANSPARENT CONDUCTIVE SENSOR USED IN SAME

CROSS-REFERENCE TO RELATED APPLICATIONS

This U.S. National stage application claims priority under 35 U.S.C. §119(a) to Japanese Patent Application No. 2011-281600, filed in Japan on Dec. 22, 2011, and to Japanese Patent Application No. 2012-003961, filed in Japan on Jan. 12, 2012, the entire contents of Japanese Patent Application Nos. 2011-281600 and 2012-003961 are hereby incorporated herein by reference.

BACKGROUND

Technical Field

1. Field of the Invention

The present invention relates to a touch sensor with ornament in which a transparent conductive film layer is formed on an inner face of a transparent substrate. In particular, the present invention relates to a touch sensor with ornament, a method of manufacturing the same, and a touch sensor used in the same, in which the transparent substrate includes a flat center part and a raised outer rim part. The center part is provided with a transparent conductive film layer circuit, and the raised outer rim part is provided with a routing circuit for detecting an electrical signal from the transparent conductive film layer circuit and a decorative print layer for concealing the routing circuit.

2. Background Information

Conventionally, there is an invention of a touch panel described in JP-A-2009-169974, in which a film-based transparent conductive sensor with a transparent conductive film layer and a decorative print layer is attached to an inner face of a transparent substrate made of glass.

SUMMARY

However, the touch panel of the invention described in Patent Literature 1 causes a problem that because the decorative print layer for concealing the routing circuit is located at a frame portion, a display portion is made unavoidably smaller with respect to the outside dimensions thereof (especially in the short side direction). Therefore, there has been strong market demand for narrow framing, for which the only response was to make the width of routing circuit wiring narrower and the space between the wiring tighter. The narrow frame, however, will increase resistance, weaken detection of electrical signals, and lower productivity.

In addition, even if surface of glass is reinforced by a method such as chemical treatment, a side face portion of the glass substrate is not sufficiently reinforced and has an edged shape. Therefore, if a user of the final product, such as a cellular phone or a tablet, drops it by accident, the glass substrate may be easily broken when an impact force is applied vertically or diagonally to the side face.

A touch sensor with ornament according to a first aspect of the present invention comprises a transparent substrate with a flat center part and a raised outer rim part, and a film substrate based transparent conductive sensor with a transparent conductive film layer attached to an inner face of the transparent substrate. A transparent conductive film layer circuit of the transparent conductive film layer is formed at the flat center part, and a routing circuit for detecting an electric signal from the transparent conductive film layer circuit and a decorative print layer for concealing the routing circuit are formed at the raised outer rim part.

A touch sensor with ornament according to a second aspect of the present invention includes a transparent substrate with a flat center part and a raised outer rim part, a transparent conductive film layer formed on an inner face of the transparent substrate, a routing circuit for detecting an electric signal from the transparent conductive film layer circuit formed at the raised outer rim part, and a decorative print layer for concealing the routing circuit formed at the raised outer rim part. The transparent conductive film layer is provided with a transparent conductive film layer circuit formed at the center part.

According to the first and second aspects, a part on which the decorative print layer is formed becomes mainly a side face portion of the transparent substrate. Therefore, without narrowing a wire width and a wire space of the routing circuit, a frame portion becomes small so that a ratio of a display portion can be increased when a viewer views the touch sensor from above. Therefore, it is possible to satisfy a market demand for a thinner frame without weakening detection of electrical signals or reducing productivity.

A touch sensor with ornament according to a third aspect of the present invention has a structure of the first or second aspect, in which the decorative print layer is formed on an outer face of the transparent substrate of raised outer rim. According to this aspect, the decorative print layer is laminated on the surface different from the transparent conductive film layer and the like on the transparent substrate. Therefore, the transparent conductive film layer and the like are not degraded by residual organic solvent used for forming the decorative print layer.

A touch sensor with ornament according to a fourth aspect of the present invention has a structure of one of the first to third aspects, in which a polarization film layer is laminated between the transparent substrate and the transparent conductive film layer. According to this aspect, because the polarization film layer has an antireflection effect, light transmittance is improved, so that visibility of a display screen of a center part of the touch sensor with ornament is improved.

A touch sensor with ornament according to a fifth aspect of the present invention has a structure of the fourth aspect, in which another transparent conductive film layer is laminated between the transparent substrate and the polarization film layer. According to this aspect, multiple transparent conductive film layers are formed, and hence a multitouch effect is improved and electromagnetic wave shield effect can be added.

A touch sensor with ornament according to a sixth aspect of the present invention has a structure of one of the first to fifth aspects, in which the transparent conductive film layer contains at least one of conductive fibers and thiophene conductive polymer. A touch sensor with ornament according to a seventh aspect of the present invention has a structure of one of the first to fifth aspects, in which the transparent conductive film layer contains at least one of a fine mesh pattern metal film, a self-organized metal fine grain pattern, and a graphene.

According to one of these aspects, because the transparent conductive film layer has a resistance to bending, it is possible to support a largely raised shape though the conventional transparent conductive film made of indium-tin oxide (ITO) cannot support the same. In addition, because a crack or the like hardly occurs, there are advantages of easy handling and improvement of productivity in a gluing process.

A touch sensor with ornament according to an eighth aspect of the present invention has a structure of one of the first to seventh aspects, in which the transparent substrate is an aluminosilicate glass and is chemically reinforced by a chemical treatment after the raised outer rim part is formed. According to this aspect, because the side face portion of the glass substrate is also reinforced, resistance to an impact force vertically or diagonally applied to the side face is increased. Therefore, even if a user drops, there are fewer cases where the glass substrate is broken. In addition, because a stress in the gluing process can be easily endured, productivity in the gluing process is improved.

A touch sensor with ornament according to a ninth aspect of the present invention has a structure of one of the first to eighth aspects, in which the raised outer rim of the transparent substrate has a quadratic surface. According to this aspect, the film-based transparent conductive sensor or the transfer sheet can easily follow a shape of the transparent substrate so that defects such as wrinkles that occur easily in the gluing process are decreased. As a result, productivity in the gluing process is improved.

A touch sensor according to a tenth aspect of the present invention is used in the touch sensor with ornament of the fourth aspect, in which a transparent conductive film layer circuit is formed at a center region of the film substrate or a releasable film substrate, a cut polarization film layer is laminated on the transparent conductive film layer, a frame portion around the center region is provided with a routing circuit for detecting an electrical signal from the transparent conductive film layer circuit.

According to this aspect, the polarization film layer is formed only in the center part as a window that particularly requires polarization characteristics, and hence expensive polarization film layer can be used without waste. Therefore, the touch sensor is superior in cost performance and can be used in a middle level electronics device and the like. In addition, even in the case where the touch sensor is attached to the transparent substrate with the raised outer rim part, because there is no polarization film layer in a part corresponding to the raised outer rim, it is not expanded when the polarization film layer is glued. Thus, desired polarization characteristics can be obtained.

A method of manufacturing the touch sensor with ornament according to an eleventh aspect of the present invention includes placing a film substrate based transparent conductive sensor with a transparent conductive film layer on an inner face of a transparent substrate, the transparent substrate having a flat center part and a raised outer rim part, and attaching the transparent conductive sensor on the inner face of the transparent substrate through rotating an elastic roll along a back face of the film substrate to push the back face with the elastic roll sequentially.

A method of manufacturing the touch sensor with ornament according to a twelfth aspect of the present invention is related to the touch sensor with ornament according to one of the second to eighth aspect, and the method includes placing a transfer sheet with a transparent conductive film layer on an inner face of a transparent substrate, the transparent substrate having a flat center part and a raised outer rim part, laminating the transfer sheet onto the inner face of the transparent substrate through rotating an elastic roll along a back face of the transfer sheet to push the back face with the elastic roll sequentially, and peeling off a substrate of the transfer sheet and thereby transferring the transparent conductive film layer onto the inner face of the transparent substrate.

According to the eleventh and twelfth aspects, because the roll presses and moves sequentially, gluing speed per unit time is improved so that productivity in the gluing process is improved.

A method of manufacturing the touch sensor with ornament according to a thirteenth aspect of the present invention includes placing a transfer sheet with a transparent conductive film layer on an inner face of a transparent substrate, the transparent substrate having a flat center part and a raised outer rim part, laminating the transfer sheet onto the transparent substrate by pushing a back face of the transfer sheet with an elastic pad, and peeling off a substrate of the transfer sheet and thereby transferring the transparent conductive film layer onto the inner face of the transparent substrate.

According to this aspect, because the elastic pad is deformed flexibly, it is possible to apply the pressure for gluing even if the transparent substrate has a complicated shape.

A method of manufacturing the touch sensor with ornament according to a fourteenth invention of the present invention is related to the touch sensor with ornament according to a seventh aspect in which the transparent conductive film layer is graphene, and a catalyst metal layer is disposed between a substrate of the transfer sheet and the transparent conductive film layer. The method includes laminating the transfer sheet onto the transparent substrate by pushing the transfer sheet to the transparent substrate, peeling off a substrate of the transfer sheet and thereby transferring the transparent conductive film layer onto the inner face of the transparent substrate, and removing the catalyst metal layer. According to this aspect, the transparent conductive film made of graphene can be easily formed on the transparent substrate. Therefore, it is possible to produce the touch sensor with ornament including the transparent conductive film made of graphene with good productivity.

According to the present invention, it is possible to provide a touch sensor with ornament, a method of manufacturing the same, and a touch sensor used in the same, which can satisfy the market demand of decreasing the ratio of the frame portion while increasing the ratio of the display portion, and has sufficient strength.

DETAILED DESCRIPTION OF EMBODIMENTS

Figure 1:
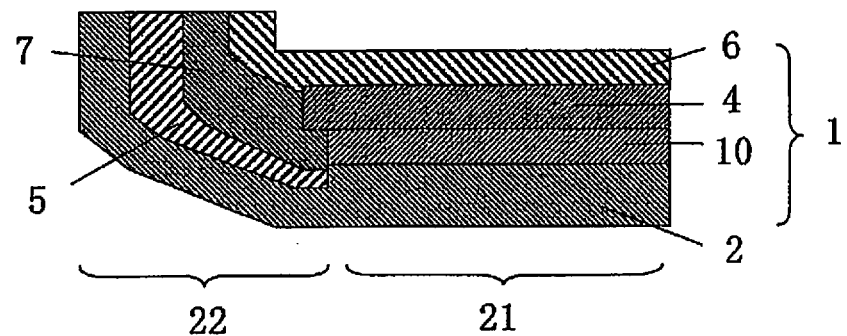
FIG. 1 is a cross-sectional view illustrating an example of a touch sensor with ornament according to a first aspect of the present invention.

Now, an embodiment of a touch sensor with ornament according to the present invention is described with reference to the drawings. With reference to FIG. 1, a touch sensor 1 with ornament according to a first aspect of the present invention includes a transparent substrate 2 with a flat center part 21 and a raised outer rim part 22, and a transparent conductive sensor 3 with a film substrate 6 and a transparent conductive film layer 4 attached to an inner face of the transparent substrate 2. In addition, with reference to FIG. 2, the touch sensor 1 with ornament according to a second aspect of the present invention includes the transparent substrate 2 with the flat center part 21 and the raised outer rim part 22, and the transparent conductive film layer 4 transferred and formed onto the inner face of the transparent substrate 2.

Figure 2:
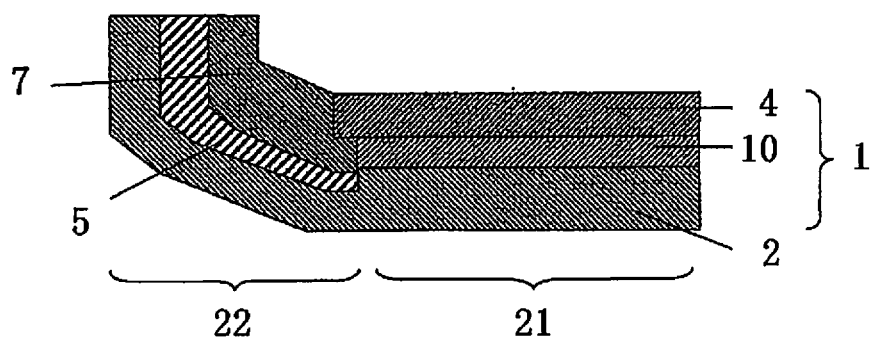
FIG. 2 is a cross-sectional view illustrating an example of a touch sensor with ornament according to a second aspect of the present invention.

In addition, with reference to FIG. 1 and FIG. 2, in each of the touch sensors with ornament 1 of the first and second aspects, a routing circuit 7 for detecting an electrical signal from a circuit of the transparent conductive film layer 4 and a decorative print layer 5 for concealing the routing circuit 7 are formed at the raised outer rim part 22. In addition, a polarization film layer 10 is laminated and formed between the transparent substrate 2 and the transparent conductive film layer 4.

As the transparent substrate 2, there may be a transparent resin molded product made of polycarbonate, acrylic, cycloolefin, or other transparent resin material molded into a solid shape, or a glass plate made of soda glass, borosilicate glass, aluminosilicate glass, or the like processed into a solid shape. If the transparent substrate 2 having superior strength is selected, a thickness of the transparent substrate 2 can be reduced. Then, it is possible to achieve a thin touch sensor 1 with ornament, and a low-profile electronics device such as a cellular phone or a tablet terminal equipped with the touch sensor 1 with ornament.

Chemically reinforced aluminosilicate glass is preferred particularly in that it has a compressive strength several times larger than that of other materials and that it can be reinforced even with a small thickness As a method of the chemical reinforcement, there is a process in which melted aluminosilicate glass is dipped in a salt bath containing potassium salt, e.g., potassium nitrate of 85 weight percent or higher at a bath temperature of 300 to 600 degrees Celsius for 1 to 15 hours so that sodium ions contained in the glass are discharged and potassium ions are taken in instead.

When the potassium ions having an ion radius larger than that of sodium ions are taken in, a compressive stress acts on a surface of the glass so as to reinforce the strength thereof. By this dipping process, a compressive stress zone having a thickness of approximately 0.2 mm and a flexural strength of approximately 500 N/mm$^2$ is formed. Then, in the glass plate after this chemical reinforcement, after processing the outer rim part of the glass plate into the raised outer rim, not only the strength of the flat center part but also the strength of the raised outer rim part is largely increased. Therefore, the chemically reinforced glass plate can provide a sufficient strength substantially to the whole even by a thickness of 3 mm or smaller, and hence the electronics device can have lower thickness and lighter weight.

With reference to FIG. 1 and FIG. 2, as to the shape of the outer rim part 22, it is preferred that a height of the raised part should be 1 to 5 mm and that the curvature radius of the raised part corner should be 0.5 to 5 mm. If the height of the raised part is smaller than 1 mm, the narrow framing is insufficient. If the height is higher than 5 mm, the gluing becomes difficult. In addition, by setting the curvature radius of the raised part corner to 0.5 mm or larger, an external impact applied to the outer rim part corner is dispersed so that the transparent substrate 2 is unlikely to break. In addition, the transparent conductive sensor 3 or a transfer sheet 33 to be glued can easily follow the curvature so that gluing becomes easy.

Figure 5:
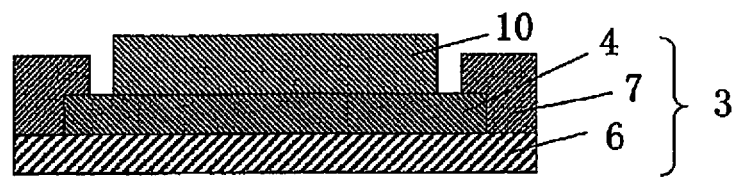
FIG. 5 is a cross-sectional view illustrating an example of a transparent conductive sensor used in the touch sensor with ornament of the present invention.

Next, with reference to FIG. 5, the transparent conductive sensor 3 to be glued onto the transparent substrate 2 is explained. The transparent conductive sensor 3 includes at least the transparent conductive film layer 4 formed on the film substrate 6. Further, it is possible to form the polarization film layer 10 on the transparent conductive film layer 4 in advance. As the film substrate 6, it is possible to use a resin film such as polycarbonate film, cycloolefin film, acrylic film, polyethylene terephthalate film, or polybutylene terephthalate film. The thickness of the film substrate is usually 30 to 500 μm.

Note that the film substrate 6 described here may be made of a material other than the above-mentioned resin, as long as the substrate has bending characteristics of a bending stress smaller than 150 MPa at a bending radius of 5 cm as determined by a bending test using a tester of JIS K-7171. For instance, the film substrate 6 may be a flexible substrate such as alkali-free borosilicate glass having a thickness of 50 to 100 μm, for example, which has bending characteristics similar to those of the above-mentioned resin films.

As the material of the transparent conductive film layer 4, a metal oxide such as tin oxide, indium oxide, antimony oxide, zinc oxide, cadmium oxide, indium tin oxide (ITO) can be usually used. However, in the present invention, there is a case where a part of the transparent conductive film layer 4 is formed at the raised part to follow the same. Therefore, it is preferred to use more flexible material than these metal oxides.

As the flexible transparent conductive film layer 4, there may be a transparent conductive film containing very fine conductive fibers (namely, metal nanofibers, metal nanowires, or carbon nanotubes) made of conductive metal such as gold, silver, copper, tin, nickel, aluminum, or palladium, or carbon, a transparent conductive film in which conductive metal such as gold, silver, copper, tin, nickel, aluminum, or palladium is patterned or self-organized into fine wires that cannot be visually recognized so as to be transparent apparently, or a transparent conductive film made of thiophene conductive polymer such as polyethylenedioxythiophene (PEDOT).

It is preferred that the very fine conductive fibers have a cross-sectional diameter of 10 to 200 nm and an aspect ratio of 10 to 100000 from a viewpoint of optical characteristics and conductivity. The transparent conductive film layer 4 can be patterned by a method in which the conductive fibers are contained in a transparent binder to make ink and patterned by a general printing method, a method of clear coating on the entire surface and lifting off for patterning, or the like.

As the conductive metal pattern that cannot be visually recognized, there may be a grid-like pattern or a honeycomb pattern having a wire width of 100 μm or smaller and a numerical aperture (the ratio of a part without the conductive metal pattern per unit area) of 90% or larger. This pattern may be formed by a method of liftoff or etching. Alternatively, it is possible to form the above-mentioned pattern by a self-organizing method in which a solution cast film forming method using hydrophobic solvent and a vapor frosting phenomenon are combined, or to form the pattern using silver halide photographic technology.

In addition, if graphene is used as the transparent conductive film layer, there is a method in which graphene is contained in the transparent binder to be used as ink, and a general printing method is used for forming the pattern. However, in terms of forming a transparent conductive film layer having good quality, it is preferred to adopt a method in which: a catalyst metal layer made of copper, nickel, or the like is placed on a releasable film substrate, the graphene is formed by a method of CVD or the like and patterned by liftoff or the like, the transparent conductive film layer is transferred onto each catalyst metal layer, and the catalyst metal layer is removed after the transferring process.

As the thickness of the catalyst metal layer is smaller, an average roughness is smaller so that the catalyst metal layer can be easily removed later. Therefore, the catalyst metal layer is formed at a thickness of 10 to 80 nm by a vacuum deposition method, a spattering method, an ion plating method, a plating method, or the like. As a CVD method, a plasma CVD is preferred because the formation can be performed at low temperature. As a method of removing the catalyst metal layer after the transferring process, there is a method of dipping a thing which was passed through the transferring process in an acid or alkali solution for a few seconds and then promptly cleaning by water.

Note that if the transparent conductive film layer 4 has sufficient conductivity, it may be extended to a terminal portion that is to connect with an external circuit. However, because transparency and conductivity are generally in a trade-off relationship, it is preferred to separately form the routing circuit 7 for smooth transmission of electrical signals in parts other than the display portion. The routing circuit 7 is usually formed by a general method of printing conductive ink, such as silver paste, or liftoff or etching of conductive metal such as copper.

As the attaching method, there is a method of placing the transparent conductive sensor 3 on the transparent substrate 2 and pressing the film substrate 6 from back face of the film substrate 6 with an elastic pad. With this method, because the elastic pad is deformed flexibly, the pressure can be applied for gluing even if the transparent substrate 2 has a complicated shape.

Figure 7:
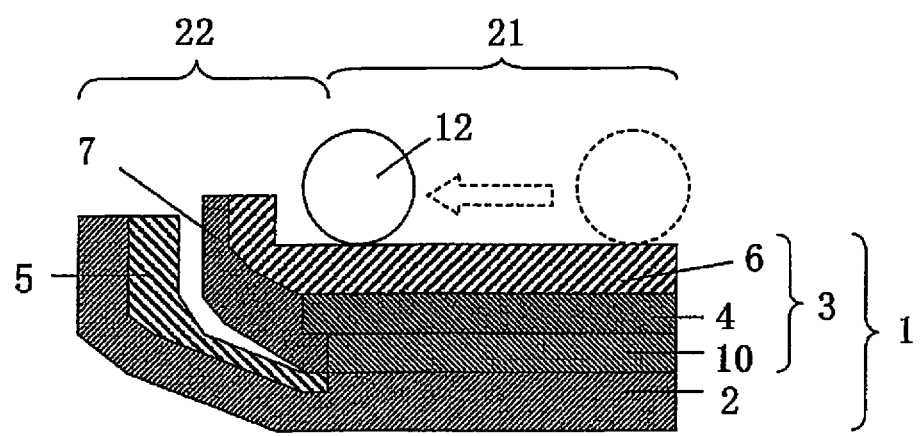
FIG. 7 is a cross-sectional view illustrating an example of a method of manufacturing the touch sensor with ornament according to a twelfth aspect of the present invention.

In addition, with reference to FIG. 7, if the raised outer rim of the transparent substrate 2 is a quadratic surface in one direction, it is possible to attach the transparent conductive sensor 3 onto the transparent substrate 2 through rotating an elastic roll 12 along a back face of the film substrate 6 to push the back face with the elastic roll 12 sequentially, instead of using the elastic pad, so as to glue the film substrate 6. In this method, because the roll sequentially presses and moves, the gluing can be performed at high speed so that the productivity is improved. Note that it is preferred to warp the transparent conductive sensor 3 in advance so as to fit easily along the transparent substrate 2.

It is preferred to perform the gluing by using optical clear double-sided adhesive tape (OCA) or a pressure-sensitive adhesive tape (PSA) having stickiness and high optical transparency. A material of the adhesive that is mainly used is polymethacrylic acid. As the elastic pad, there is a pad made of silicone rubber that has a hardness of approximately 45 to 60. As the elastic roll 12, there is a roll made of silicone rubber having a hardness of approximately 60 to 90. It is preferred to set the pressing force to approximately 0.5 to 2 MPa.

Figure 6:
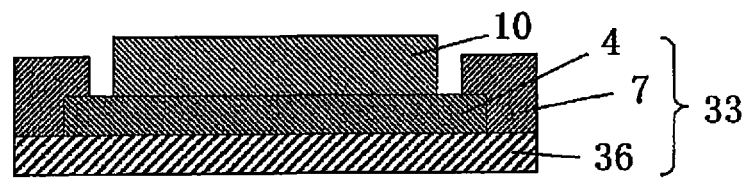
FIG. 6 is a cross-sectional view illustrating an example of a transfer sheet used in the touch sensor with ornament of the present invention.

Next, with reference to FIG. 6, the transfer sheet 33 is described, which is for transferring and forming the transparent conductive film layer 4 onto the transparent substrate 2. The transfer sheet 33 includes at least the transparent conductive film layer 4 formed on a releasable film substrate 36, and an adhesive layer or the like is formed if necessary. Further, it is possible to form the polarization film layer 10 in advance on the transparent conductive film layer 4. Materials and the like of the transparent conductive film layer 4 and the polarization film layer 10 may be the same as those of the transparent conductive sensor 3 described above.

For the releasable film substrate 36, it is possible to use an inexpensive resin film having good processability, such as a polyvinyl chloride film, a polypropylene film, a polyethylene terephthalate film, and the like. Usually, a thickness of the film substrate is set to approximately 15 to 50 μm. Note that it is preferred to form a release layer made of melamine or silicone resin on the resin film by a general print method, because releasability would be improved. In addition, it is preferred to form a peel layer made of acrylic or vinyl resin on the resin film or the release layer by a general print method, because peelability would be improved.

The adhesive layer can be formed by a general print method such as gravure printing, screen printing, or offset printing, or by applying, dipping, reverse coating, or the like. As a main material of the adhesive layer, there may be acrylic resin, vinyl resin, polyurethane resin, epoxy resin, or the like, if the transparent substrate 2 is made of a transparent resin material. If the transparent substrate 2 is made of glass, polyamide resin, acrylic resin, or the like may be used. It is preferred to add silane coupling agent to the main material so as to improve adhesiveness.

As a transfer method, there is a method of placing the transfer sheet 33 on the transparent substrate 2, and pressing the transfer sheet 33 from its back face with the elastic pad so that the transparent conductive film layer 4 is transferred and formed onto the transparent substrate 2. In this method, because the elastic pad is flexibly deformed, the pressure can be applied even if the transparent substrate has a complicated shape. As a result, the transfer and formation can be performed. As the elastic pad, there is a pad made of silicone rubber having a hardness of approximately 45 to 60.

Figure 8:
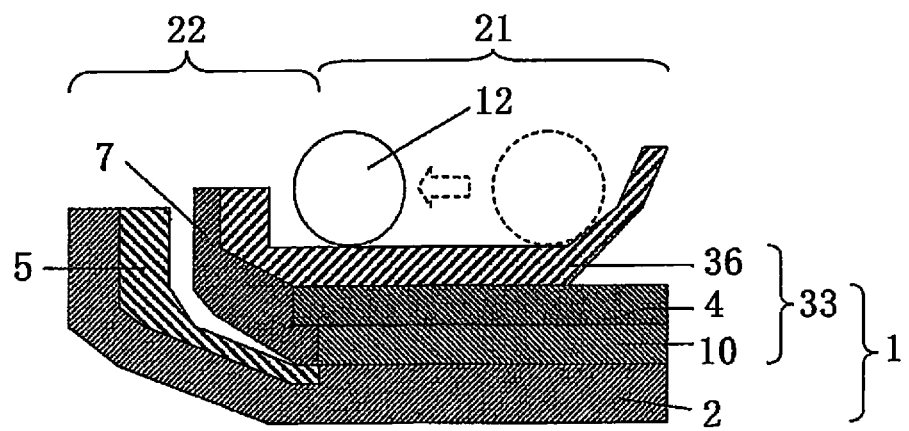
FIG. 8 is a cross-sectional view illustrating an example of a method of manufacturing the touch sensor with ornament according to thirteenth aspect of the present invention.

In addition, with reference to FIG. 8, if the raised outer rim of the transparent substrate 2 is an one-way quadratic surface, it is possible to press the transfer sheet 33 to transfer and form the transparent conductive film layer 4 onto the transparent substrate 2 through rotating an elastic roll 12 along a back face of the transfer sheet 33 to push the back face with the elastic roll 12 sequentially, instead of using the elastic pad. In this method, because the roll sequentially presses and moves, the transferring can be performed at high speed. Thus, productivity is improved. Note that it is preferred to squeeze the transfer sheet 33 to be a curved or 3-D shape in advance so as to fit easily along the transparent substrate 2. As the elastic roll 12, there is a roll made of silicone rubber having a hardness of approximately 60 to 90. It is preferred to set the pressing force to approximately 0.5 to 2 MPa.

Note that, in the embodiments described above, the transparent conductive sensor 3 and the transfer sheet 33 only include one transparent conductive film layer 4, but it is possible that a plurality of laminated transparent conductive film layers are provided. In the transparent conductive sensor 3, transparent conductive film layers 4 may be formed on each of the front and back surfaces of the film substrate 6. A capacitive transparent conductive sensor including a plurality of transparent conductive film layers 4 has an advantage that multitouch input or the like can be smoothly performed. In addition, in FIG. 1 and FIG. 3, the transparent conductive film layer 4 and the routing circuit 7 are illustrated as being formed on a surface of the film substrate 6 towards the transparent substrate 2, but each layer may be formed on the surface of the film substrate 6 opposite to the transparent substrate 2.

Next, the decorative print layer 5 is described. The decorative print layer 5 has not only a function as a frame of the flat center part 21 corresponding to the display screen, but also a function of concealing the routing circuit 7 that transmits electrical signals from the transparent conductive film layer 4 to the external circuit. However, when the decorative print layer 5 is formed also on the flat center part 21 of the transparent substrate 2, it reduces the display screen of the electronics device. Therefore, as illustrated in FIG. 1 and FIG. 2, it is most preferred to align the decorative print layer 5 so that the entire flat center part 21 of the transparent substrate 2 is the display screen of only the transparent conductive film layer 4 while the frame of the decorative print layer 5 is formed at the raised outer rim part 22.

Therefore, the decorative print layer 5 is formed so that the center part is an opening around which the frame pattern is made. The shape and size of the center part opening are set in accordance with the shape and size of an input area or a display area of the electronics device, and are preferred to be the same as those of the flat center part 21 of the transparent substrate 2. In this way, as illustrated in FIG. 1 and FIG. 2, when the transparent conductive sensor 3 or the transfer sheet 33 is placed on the transparent substrate 2, the decorative print layer 5 is formed at the raised part 22 on the side face, and the entire flat center part 21 is the input area constituted of the transparent conductive film layer 4 when aligned. Thus, it is possible to realize an ultimate narrower frame.

Figure 3:
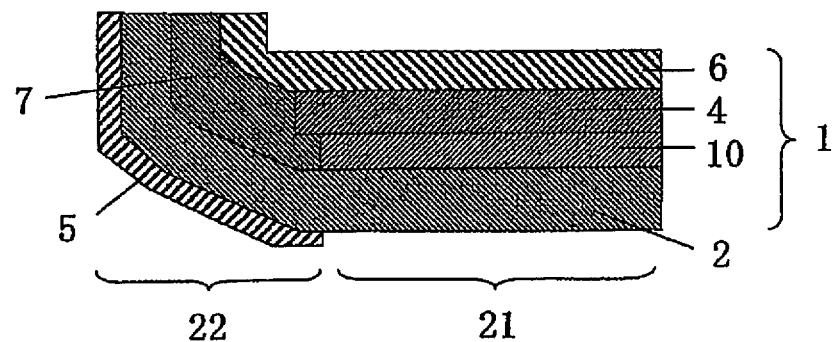
FIG. 3 is a cross-sectional view illustrating an example of a touch sensor with ornament according to a third aspect of the present invention.

As a method of forming the decorative print layer 5 on the outer rim part 22, there is a method in which the decorative print layer 5 is formed as one of the layers that constitute the transparent conductive sensor 3 or the transfer sheet 33, as described above. However, in this case, it is necessary to form the layer with high position accuracy with respect to the transparent conductive film layer 4 and the routing circuit 7, and it is necessary to avoid any severe effect from a step difference due to thickness of the decorative print layer 5 towards the formation of the transparent conductive film layer 4 and the routing circuit 7. If such an effect cannot be avoided, it is possible to form the decorative print layer 5 on the transparent substrate 2 separately from the transparent conductive sensor 3 and the transfer sheet 33. In this case, it may be formed on the inner surface of the transparent substrate 2, or it may be formed on the outer surface of the transparent substrate 2 as illustrated in FIG. 3.

In this case, it is possible to form the decorative print layer 5 directly on the transparent substrate 2 by pad printing, mask application, or the like. Alternatively, it is possible to form the decorative print layer 5 on another transfer sheet in advance by screen printing, gravure printing, offset printing, or the like, and then to place it onto the transparent substrate 2 by a transfer method using a transfer pad or the like. In addition, if the transparent substrate 2 is a transparent molded resin substrate, it is possible to form the decorative print layer 5 by a simultaneous molding and decorating method. In this case, it is possible to integrally form the polarization film layer 10 simultaneously to the molding. If the decorative print layer 5 is formed on the outer surface of the transparent substrate 2 as illustrated in FIG. 3, the decorative print layer 5 is formed on a surface of the transparent substrate 2 that is different from the surface on which the transparent conductive film layer 4 or the like is formed. Therefore, it is possible to obtain the effect of preventing the transparent conductive film layer 4 and the like from being degraded due to the residual organic solvent used for forming the decorative print layer 5.

As for the decorative print layer 5, it is preferred to use coloring ink containing a binder such as polyvinyl resin, polyimide resin, polyester resin, acrylic resin, polyurethane resin, polyvinyl acetal resin, polyester polyurethane resin, or alkyd resin, and appropriate color pigment or dye as coloring agent. A thickness of the decorative print layer 5 is usually set to approximately 0.5 to 10 μm.

In addition, the decorative print layer 5 may be made of a metal thin film layer or a combination of the metal thin film layer and the above-mentioned printed layer. The metal thin film layer expresses metallic luster and may be formed by a vacuum deposition method, a spattering method, an ion plating method, a plating method, or the like. In this case, corresponding to the desired color with metallic luster, it is possible to use metal such as aluminum, nickel, gold, platinum, ferrochrome, copper, tin, indium, silver, titanium, lead, or zinc, or an alloy or compound of them. The thickness of the metal thin film layer is usually set to approximately 0.05 μm. In addition, when the metal thin film layer is to be disposed, it is possible to dispose a front anchor layer or a rear anchor layer so as to improve its adhesiveness with other layers.

Figure 4:
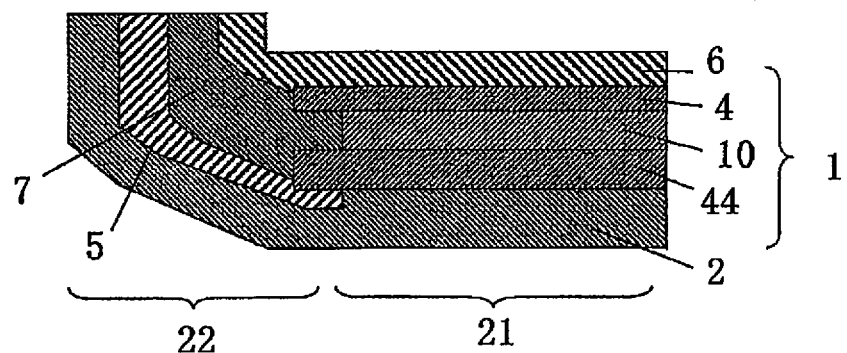
FIG. 4 is a cross-sectional view illustrating an example of a touch sensor with ornament according to a sixth aspect of the present invention.

In addition, with reference to FIG. 1 and FIG. 2, it is possible to laminate and form the polarization film layer 10 between the transparent substrate 2 and the transparent conductive film layer 4. When the polarization film layer 10 is formed, because the polarization film layer 10 has an antireflection effect, light transmittance of the touch sensor 1 with ornament is improved and that visibility of the display screen in the center part is improved. Further, with reference to FIG. 4, it is possible to laminate and form still another transparent conductive film layer 44 between the transparent substrate 2 and the polarization film layer 10. With this structure, a plurality of transparent conductive film layers are formed, and hence the multitouch effect is improved and the electromagnetic wave shield effect can be obtained.

The polarization film layer 10 is a film layer that transmits only light oscillating in one direction. The polarization film layer 10 is usually a layer in which a linear polarization film and a phase difference film are laminated, but may also be a single layer of the linear polarization film in the present invention. A part of a light beam entering from outside is reflected by the interface of the film substrate 6 or the transparent conductive film layer 4, which causes difficulty in viewing the display screen of the electronics device, or the like. In this case, an oscillation direction of the light changes on the reflection surface. Utilizing this characteristic, the polarization film layer 10 blocks the detrimental reflection light beam reflected by the interface and having a changed oscillation direction. Thus, there is an effect of reducing the reflectance, so that the display screen can be easily viewed.

The linear polarization film is a film that transmits only one of polarized light components of the incident light and blocks the other component by absorption (or reflection or dispersion). As the linear polarization film, a film may be used which is highly extended and oriented after dying and absorbing dichroic material such as iodine or organic dye in polyvinyl alcohol resin, a triacetyl cellulose film, and the like. The thickness is approximately 10 to 100 μm.

The phase difference film is a transparent film to which a predetermined distortion is provided through extension or the like. As a material of the transparent film, polycarbonate resin, cycloolefin resin, liquid crystal polymer resin, or the like may be used. The thickness of the film is approximately 10 to 100 μm.

It is preferred to cut and form the polarization film layer 10 only in the flat center part corresponding to the display, and its vicinity, of the electronics device or the like required to have the polarization characteristics as illustrated in FIG. 5 and FIG. 6, rather than forming the polarization film layer 10 on the entire surface. It is because the expensive polarization film layer 10 can be used without waste. Therefore, the touch sensor that has a good cost performance can be realized and can be used in middle level electronic device or the like, too. In addition, even if the touch sensor is glued to the transparent substrate with the raised outer rim part, the polarization film layer 10 is not present in the part corresponding to the raised outer rim. Therefore, the polarization film layer 10 would not expand when glued, and hence desired polarization characteristics can be obtained.

Note that it is preferred that the cut surface of the cut polarization film layer 10 be slanted in cross section. Increasing of the slant of the cut surface makes the transparent conductive film layer 4 fit the transparent substrate easily, so that even the transparent conductive film layer 4 made of a material with little flexibility can be used. Thus, a selection range of the materials can be increased. In addition, defects of wrinkles or bubbles, which are caused by a step difference due to the cut polarization film layer 10 when glued to the transparent substrate, are decreased so that the productivity is improved.

A cut pattern of the polarization film layer 10 is set in accordance with the shape and size of the input area or the display area of the electronic device. It is preferred to set the cut pattern to be a little larger than the area and to be of the same size as that of the flat center part of the transparent substrate 2. In this way, even a small misregistration in the gluing process would not cause a problem.

As a method of cutting the polarization film layer 10, a punching method may be used which uses a sharp blade or a laser cutting method may be used which uses a laser beam from a carbon dioxide gas laser, or the like. In particular, by emitting the laser beam diagonally, the slanted cut surface can be realized appropriately.

With reference to FIG. 5 and FIG. 6, as a method of laminating and forming the cut polarization film layer 10 effectively between the transparent substrate 2 and the transparent conductive film layer 4, there is a method that includes: producing a transparent conductive sensor 3 or a transfer sheet 33, in which the circuit of the transparent conductive film layer 4 is formed at the center part that serves as a window of the film substrate 6 or the releasable film substrate 36, the cut polarization film layer 10 is laminated and formed on the transparent conductive film layer 4, and the routing circuit 7 for detecting electrical signals from the circuit of the transparent conductive film layer 4 is formed in the frame portion around the center part that serves as the window, and gluing or adhering the polarization film layer 10 to the transparent substrate 2.

When gluing the transparent conductive sensor 3 to the transparent substrate 2, it is preferred to apply optical transparent adhesive or pressure sensitive adhesive onto the polarization film layer 10, or to use a sheet in which separators are formed on both sides of an optical transparent adhesive layer in advance so that one of the separators is peeled for adhering the polarization film layer 10. As the optical transparent adhesive layer, an acrylic resin adhesive layer having a thickness of 20 to 200 µm may be used.

The invention claimed is:

1. A touch sensor with ornament comprising:
    a transparent substrate with a flat center part and a raised outer rim part;
    a transparent conductive sensor attached to an inner face of the transparent substrate, the transparent conductive sensor comprising
        a film substrate;
        a transparent conductive film layer provided with a transparent conductive film circuit formed at the flat center part; and
        a routing circuit formed at the raised outer rim part and configured to detect an electric signal from the transparent conductive film circuit; and
    a decorative print layer formed at the raised outer rim part and configured to conceal the routing circuit.

2. The touch sensor with ornament according to claim 1, wherein
    the transparent conductive film layer is formed on the inner face of the transparent substrate; and
    the film substrate is releasable.

3. The touch sensor with ornament according to claim 1, wherein the decorative print layer is formed on an outer face of the transparent substrate at the raised outer rim part.

4. The touch sensor with ornament according to claim 1, wherein a polarization film layer is laminated between the transparent substrate and the transparent conductive film layer.

5. The touch sensor with ornament according to claim 4, wherein another transparent conductive film layer is laminated between the transparent substrate and the polarization film layer.

6. The touch sensor with ornament according to claim 1, wherein the transparent conductive film layer contains at least one of conductive fibers and thiophene conductive polymer.

7. The touch sensor with ornament according to claim 1, wherein the transparent conductive film layer contains at least one of a fine mesh pattern metal film, a self-organized metal fine grain pattern, and a graphene.

8. The touch sensor with ornament according to claim 1, wherein the transparent substrate is an aluminosilicate glass and is chemically reinforced by chemical treatment after the raised outer rim part is formed.

9. The touch sensor with ornament according to claim 1, wherein the raised outer rim part of the transparent substrate has a quadratic surface.

10. A method of manufacturing the touch sensor with ornament as recited in claim 1, comprising:
    placing the transparent conductive sensor with the transparent conductive film layer on an inner face of the transparent substrate; and
    attaching the transparent conductive sensor onto the inner face of the transparent substrate through rotating an elastic roll along a back face of the film substrate to push the back face with the elastic roll sequentially.

11. A method of manufacturing the touch sensor with ornament as recited in claim 1, comprising:
    preparing the transparent substrate with the flat center part and the raised outer rim part;
    placing a transfer sheet with the transparent conductive film layer on the inner face of the transparent substrate;
    laminating the transfer sheet onto the inner face of the transparent substrate through rotating an elastic roll along a back face of the transfer sheet to push the back face with the elastic roll sequentially; and
    peeling off a substrate of the transfer sheet and thereby transferring the transparent conductive film layer onto the inner face of the transparent substrate.

12. A method of manufacturing the touch sensor with ornament as recited in claim 1, comprising:
    preparing the transparent substrate with the flat center part and the raised outer rim part;
    placing a transfer sheet with the transparent conductive film layer on the inner face of the transparent substrate;

laminating the transfer sheet onto the transparent substrate by pushing a back face of the transfer sheet with an elastic pad; and peeling off a substrate of the transfer sheet and thereby transferring the transparent conductive film layer onto the inner face of the transparent substrate.

13. A method of manufacturing the touch sensor with ornament as recited in claim 7, wherein the transparent conductive film layer is graphene, and a catalyst metal layer is disposed between a substrate of the transfer sheet and the transparent conductive film layer, the method comprising:

laminating the transfer sheet onto the transparent substrate by pushing the transfer sheet to the transparent substrate;

peeling off a substrate of the transfer sheet and thereby transferring the transparent conductive film layer onto the inner face of the transparent substrate; and removing the catalyst metal layer.

14. The touch sensor with ornament according to claim 1, wherein the film substrate is releasable.

15. The method of manufacturing the touch sensor with ornament according to claim 10, wherein the transparent substrate is an aluminosilicate glass chemically reinforced by chemical treatment after the raised outer rim part is formed.

16. The method of manufacturing the touch sensor with ornament according to claim 11, wherein the transparent substrate is an aluminosilicate glass chemically reinforced by chemical treatment after the raised outer rim part is formed.

17. The method of manufacturing the touch sensor with ornament according to claim 12, wherein the transparent substrate is an aluminosilicate glass chemically reinforced by chemical treatment after the raised outer rim part is formed.

18. The method of manufacturing the touch sensor with ornament according to claim 13, wherein the transparent substrate is an aluminosilicate glass chemically reinforced by chemical treatment after the raised outer rim part is formed.

19. A transparent conductive sensor to be attached to an inner face of the touch sensor with ornament as recited in claim 1, the transparent conductive sensor comprising:

the transparent conductive film circuit formed at a center region of the film substrate corresponding to the flat center part of the transparent substrate;

a polarization film layer laminated on the transparent conductive film layer, the polarization film layer being cut to fit the flat center part; and the routing circuit formed on a frame portion corresponding to the raised outer rim part.

* * * * *